United States Patent
Kim et al.

(10) Patent No.: US 10,470,319 B2
(45) Date of Patent: Nov. 5, 2019

(54) WINDOW AND A DISPLAY APPARATUS INCLUDING THE SAME

(71) Applicant: SAMSUNG DISPLAY CO., LTD., Yongin-si, Gyeonggi-do (KR)

(72) Inventors: Hwanjin Kim, Hwaseong-si (KR); Hyun-il Cho, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 9 days.

(21) Appl. No.: 15/631,408

(22) Filed: Jun. 23, 2017

(65) Prior Publication Data
US 2017/0374752 A1 Dec. 28, 2017

(30) Foreign Application Priority Data

Jun. 24, 2016 (KR) .................. 10-2016-0079491

(51) Int. Cl.
| | |
|---|---|
| *H05K 5/00* | (2006.01) |
| *H01L 51/52* | (2006.01) |
| *H05K 5/03* | (2006.01) |
| *H04M 1/02* | (2006.01) |
| *H01R 12/77* | (2011.01) |
| *H05K 1/14* | (2006.01) |

(52) U.S. Cl.
CPC .......... *H05K 5/0017* (2013.01); *H01L 51/524* (2013.01); *H04M 1/0266* (2013.01); *H05K 5/0004* (2013.01); *H05K 5/03* (2013.01); *H01R 12/77* (2013.01); *H05K 1/148* (2013.01); *H05K 2201/10128* (2013.01)

(58) Field of Classification Search
CPC ... H05K 5/0017; H01L 51/524; H04M 1/0202
See application file for complete search history.

(56) References Cited

U.S. PATENT DOCUMENTS

| | | | |
|---|---|---|---|
| 6,686,031 | B2 | 2/2004 | Matsufuji et al. |
| 7,005,176 | B2 | 2/2006 | Tojo et al. |
| 7,976,742 | B2 | 7/2011 | Hsieh et al. |
| 8,916,266 | B2 | 12/2014 | Takanohashi et al. |

(Continued)

FOREIGN PATENT DOCUMENTS

| | | |
|---|---|---|
| JP | 2003-255647 | 9/2003 |
| JP | 2005-196067 | 7/2005 |

(Continued)

*Primary Examiner* — Hoa C Nguyen
*Assistant Examiner* — Keith DePew
(74) *Attorney, Agent, or Firm* — F. Chau & Associates, LLC

(57) ABSTRACT

A display apparatus includes a display panel configured to display an image; a window disposed on the display panel and including a transmission area transmitting the image and a non-transmission area adjacent to the transmission area; and a case member configured to receive the display panel and coupled to the window. The window includes a substantially flat base member and a protective member disposed on the base member. The protective member includes a first portion overlapping the non-transmission area and having a first upper surface. The first upper surface is curved. The protective member also includes a second portion overlapping the transmission area and connected to the first portion.

23 Claims, 5 Drawing Sheets

(56) References Cited

U.S. PATENT DOCUMENTS

| | | | |
|---|---|---|---|
| 8,916,272 B2 | 12/2014 | Son et al. | |
| 9,643,389 B2* | 5/2017 | Roh | H01L 51/0097 |
| 9,730,344 B2* | 8/2017 | Park | H05K 5/0017 |
| 9,781,846 B2* | 10/2017 | Sanford | H05K 5/0013 |
| 9,888,753 B2* | 2/2018 | Richardson | A45C 11/00 |
| 2008/0299348 A1 | 12/2008 | Liu | |
| 2009/0080153 A1* | 3/2009 | Richardson | H04M 1/18 |
| | | | 361/679.56 |
| 2010/0061039 A1* | 3/2010 | Sanford | H05K 5/0013 |
| | | | 361/679.01 |
| 2010/0255413 A1 | 10/2010 | Wu et al. | |
| 2012/0281383 A1* | 11/2012 | Hwang | G02F 1/133308 |
| | | | 361/807 |
| 2012/0327572 A1* | 12/2012 | Peng | H04M 1/0249 |
| | | | 361/679.01 |
| 2014/0162009 A1 | 6/2014 | Hwang | |
| 2014/0193224 A1 | 7/2014 | McCabe | |
| 2014/0245247 A1 | 8/2014 | Fujimura et al. | |
| 2014/0332833 A1 | 11/2014 | Kim | |
| 2015/0010742 A1* | 1/2015 | Han | B32B 27/08 |
| | | | 428/215 |
| 2015/0086763 A1* | 3/2015 | Nam | H01L 51/524 |
| | | | 428/212 |
| 2015/0252212 A1 | 9/2015 | Kang et al. | |
| 2015/0277131 A1* | 10/2015 | Park | G02B 27/2221 |
| | | | 349/58 |
| 2015/0296634 A1* | 10/2015 | Itoh | G02F 1/133308 |
| | | | 361/679.01 |
| 2015/0351272 A1* | 12/2015 | Wildner | G02F 1/133308 |
| | | | 361/679.21 |
| 2016/0066440 A1* | 3/2016 | Choi | G06F 1/1637 |
| | | | 361/679.3 |
| 2016/0236382 A1* | 8/2016 | Lee | B29C 44/08 |
| 2017/0135239 A1* | 5/2017 | Hyun | H05K 1/115 |

FOREIGN PATENT DOCUMENTS

| | | |
|---|---|---|
| JP | 2009-015289 | 1/2009 |
| JP | 2010-275385 | 12/2010 |
| JP | 2011-074199 | 4/2011 |
| JP | 2012-128086 | 7/2012 |
| JP | 2012-183822 | 9/2012 |
| JP | 2013-208896 | 10/2013 |
| JP | 2014-117904 | 6/2014 |
| JP | 2015-086778 | 4/2015 |
| JP | 2015-105993 | 6/2015 |
| JP | 5769625 | 8/2015 |
| JP | 2015-183166 | 10/2015 |
| JP | 2015-534510 | 12/2015 |
| JP | 6068433 | 1/2017 |
| KR | 10-2012-0051325 | 5/2012 |
| KR | 10-2012-0072856 | 7/2012 |
| KR | 10-2013-0097137 | 9/2013 |
| KR | 10-2014-0035620 | 3/2014 |
| KR | 10-2014-0103783 | 6/2014 |
| KR | 10-2014-0110325 | 9/2014 |
| KR | 10-2014-0118692 | 10/2014 |
| KR | 10-2015-0015391 | 2/2015 |
| KR | 10-2015-0032359 | 3/2015 |
| KR | 10-2015-0033461 | 4/2015 |
| KR | 10-2015-0077134 | 7/2015 |
| KR | 10-2015-0103783 | 9/2015 |
| KR | 10-1564055 | 10/2015 |
| KR | 10-2015-0145152 | 12/2015 |
| KR | 10-1579454 | 12/2015 |

* cited by examiner

WINDOW AND A DISPLAY APPARATUS INCLUDING THE SAME

CROSS-REFERENCE TO RELATED APPLICATION

This U.S. non-provisional patent application claims priority under 35 U.S.C. § 119 to Korean Patent Application No. 10-2016-0079491, filed on Jun. 24, 2016 in the Korean Intellectual Property Office, the disclosure of which is incorporated by reference herein in its entirety.

TECHNICAL FIELD

Exemplary embodiments of the present inventive concept relate to a window, and more particularly to a display apparatus including the same.

DISCUSSION OF RELATED ART

Various display apparatuses have been used in multimedia devices such as televisions, portable phones, tablet computers, navigation systems, and game consoles.

As a result, display apparatuses having various shapes have been developed. For example, display apparatuses having various shapes may include a curved display apparatus, a bendable display apparatus, a foldable display apparatus, a rollable display apparatus, and a stretchable display apparatus.

SUMMARY

Exemplary embodiments of the present inventive concept provide a window having an increased durability, and a display apparatus including the same.

Exemplary embodiments of the present inventive concept also provide a relatively slim window, and a display apparatus including the same.

Exemplary embodiments of the present the inventive concept provide a display apparatus. The display apparatus includes a display panel, a window, and a case member. The display panel is configured to display an image. The window is disposed on the display panel. The window includes a transmission area and a non-transmission area. The transmission area is configured to transmit the image. The non-transmission area is adjacent to the transmission area. The case member is configured to receive the display panel. The case member is coupled to the window. The window includes a base member and a protective member. The base member has a substantially flat surface. The protective member is disposed on the base member. The protective member includes a first portion and a second portion. The first portion overlaps the non-transmission area. The first portion has a first upper surface. The second portion overlaps the transmission area. The second portion is connected to the first portion. The first upper surface is curved.

The base member may have a substantially uniform thickness.

The base member may include glass or plastic.

The second portion may have a second upper surface. At least a portion of the second upper surface may be substantially flat.

The second portion may have a second upper surface. The second upper surface may be connected to the first upper surface. The second upper surface may be curved.

A thickness of the first portion may gradually decrease as a distance from the second portion increase.

The first portion may surround the second portion.

The protective member may include polymethylmethacrylate (PMMA) or polycarbonate (PC).

The window may further include a coupling member. The coupling member may be disposed between the protective member and the base member. The coupling member may be configured to couple the protective member to the base member.

The coupling member may include polyurethane.

The case member may include a lower portion and a sidewall portion. The lower portion may face the display panel. The sidewall portion may be bent and extend from the lower portion.

The case member may further include a holding portion. The holding portion may be configured to support the window. A portion of the base member may be disposed on the holding portion.

The protective member may further include a third portion. The third portion may extend from the first portion. The third portion may cover an outer side surface of the sidewall portion.

Exemplary embodiments of the present inventive concept provide a window. The window includes a base member and a protective member. The base member has a substantially flat surface. The protective member is disposed on the base member. The protective member includes a first portion and a second portion. The first portion includes a first upper surface and a first lower surface. The first upper surface has a curved shape. The first lower surface is substantially flat. The second portion may be connected to the first portion. The second portion may have a second upper surface and a second lower surface. The second upper surface is connected to the first upper surface. The second lower surface is connected to the first lower surface.

The first lower surface and the second lower surface may be substantially flat.

The second portion may have a substantially uniform thickness. The second upper surface may be substantially parallel to the second lower surface.

The second upper surface may have a curved surface. A thickness of the second portion may become progressively greater toward a center of the second portion.

The window may further include a coupling member. The coupling member may be disposed between the base member and the protective member. The coupling member may be configured to couple the base member to the protective member.

Exemplary embodiments of the present inventive concept provide a window. The window includes a base member, a coupling member, and a protective member. The base member is substantially flat. The coupling member is disposed on the base member. The protective member is disposed on the coupling member. The protective member includes a first portion and a second portion. The first portion has a first upper surface and a first lower surface. The first upper surface has a curved shape. The first lower surface has a substantially flat shape. The second portion is connected to the first portion.

The coupling member may be configured to couple the base member to the protective member.

The second portion may include a second upper surface and a second lower surface. The second upper surface may be connected to the first upper surface. The second lower surface may be connected to the first lower surface.

BRIEF DESCRIPTION OF THE DRAWINGS

A more complete appreciation of the present disclosure and many of the attendant aspects thereof will be readily obtained as the same becomes better understood by the following detailed description when considered in connection with the accompanying drawings, wherein.

DETAILED DESCRIPTION OF THE EMBODIMENTS

Figure 1:
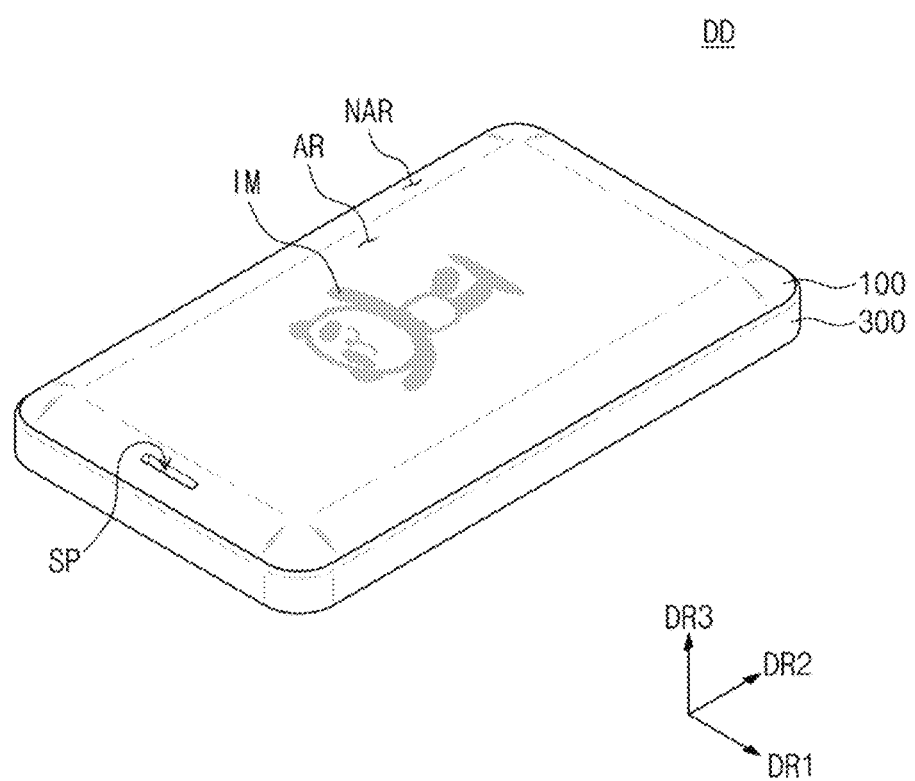
FIG. 1 is a perspective view illustrating a display apparatus according to an exemplary embodiment of the present inventive concept.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Figure 2:
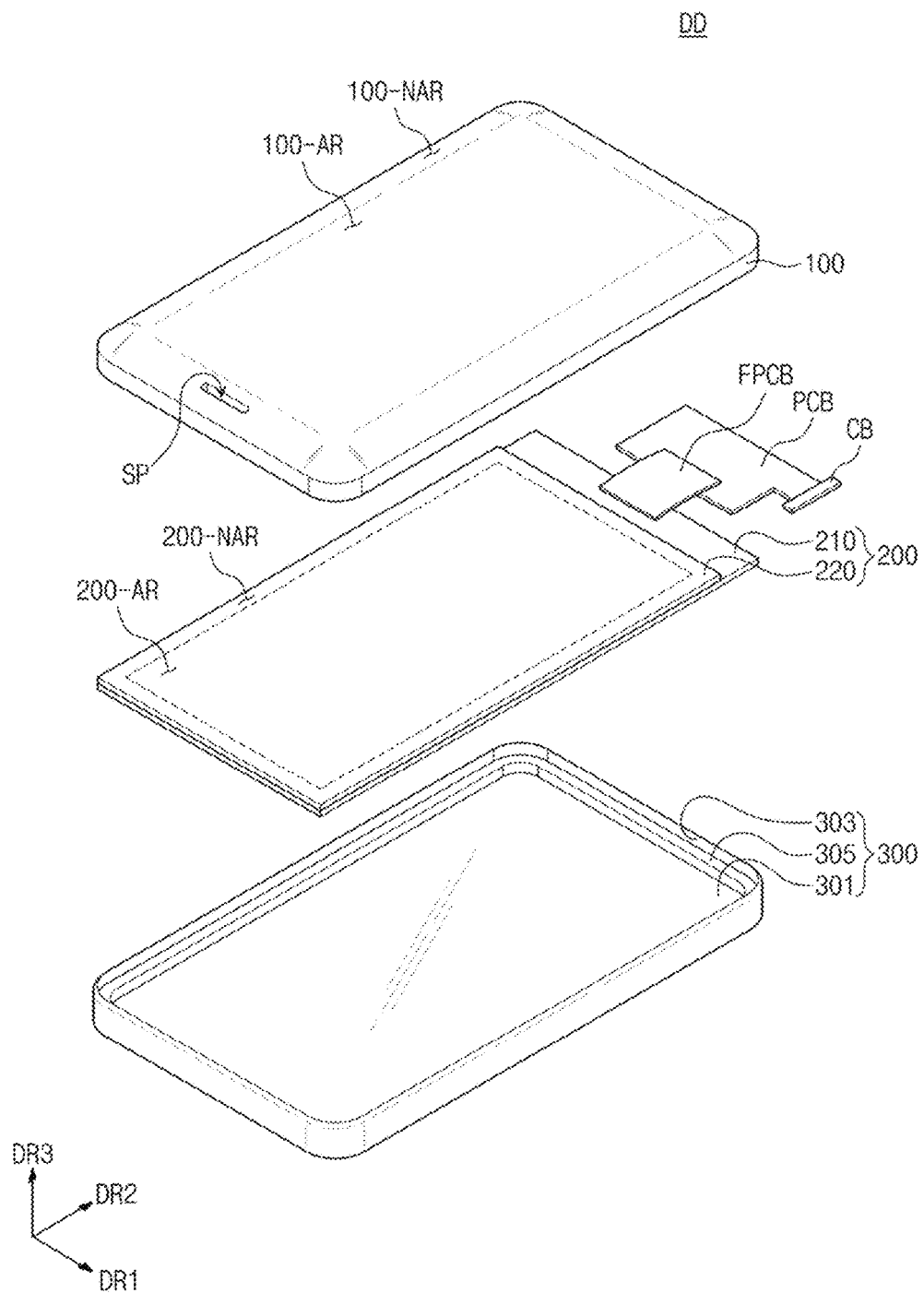
FIG. 2 is an exploded perspective view illustrating a display apparatus according to an exemplary embodiment of the present inventive concept.

FIG. 1 is a perspective view illustrating a display apparatus according to an exemplary embodiment of the present inventive concept. FIG. 2 is an exploded perspective view illustrating a display apparatus according to an exemplary embodiment of the present inventive concept.

Referring to FIG. 1, a portable terminal is illustrated as an example to which a display apparatus DD according to some embodiments of the inventive concepts is applied. The portable terminal may include a tablet personal computer (tablet PC), a smart phone, a personal digital assistant (PDA), a portable multimedia player (PMP), a game console, or a watch-type electronic device. However, exemplary embodiments of the present inventive concept are not limited thereto. Exemplary embodiments of the present inventive concept may be applied to relatively large-sized electronic devices (e.g., televisions or external billboards) and relatively small and medium-sized electronic devices (e.g., personal computers, notebook computers, car navigation units, or cameras). These are provided as examples according to embodiments of the inventive concepts, and embodiments of the inventive concepts may also be applied to other electronic devices without departing the spirits and scopes of the inventive concepts.

Referring to FIG. 1, the display apparatus DD may include a plurality of areas. The plurality of areas may be divided from each other on a display surface. The display apparatus DD may include a display portion AR and a non-display portion NAR. The non-display portion NAR may be adjacent to the display portion AR. An image IM may be displayed in the display portion AR. According to an exemplary embodiment of the present inventive concept, the display portion AR may have, for example, a quadrilateral shape. The non-display portion NAR may be disposed to at least partially surround the display portion AR.

Referring to FIGS. 1 and 2, the display apparatus DD may include a display panel 200, a window 100, and a case member 300.

The display panel 200 may display the image IM. The display panel 200 may include a display area 200-AR and a non-display area 200-NAR. The display area 200-AR may be an area that displays the image IM. The display area 200-AR may correspond to the display portion AR of the display apparatus DD. The non-display area 200-NAR may be an area that is adjacent to the display area 200-AR. The non-display area 200-NAR may correspond to the non-display portion NAR of the display apparatus DD. The non-display area 200-NAR may at least partially surround the display area 200-AR when viewed from a plan view.

According to an exemplary embodiment of the present inventive concept, the display panel 200 may be an organic light-emitting display panel. The display panel 200 may include a substrate 210, an organic light-emitting device, and a sealing layer 220. The organic light-emitting device may be disposed on the substrate 210. The sealing layer 220 may be disposed on the substrate 210. The organic light-emitting device may be disposed between the sealing layer 220 and the substrate 210. The sealing layer 220 may seal the organic light-emitting device.

The display panel 200 may have a display surface and a back surface. The display surface may display the image IM. The back surface may be opposite to the display surface. In FIG. 2, the display surface may be an upper surface of the sealing layer 220. The back surface may be a lower surface of the substrate 210.

The display surface on which the image IM is displayed may be substantially parallel to a plane defined by a first direction DR1 and a second direction DR2. A normal direction of the display surface may be substantially parallel to a third direction DR3. The third direction DR3 may be a reference direction. A front surface and a back surface of each of the members may be spaced apart from each other in the third direction D3. However, the first, second and third directions described herein may be relative concepts and may be changed.

The display apparatus DD may further include a flexible printed circuit board FPCB and a printed circuit board PCB.

The flexible printed circuit board FPCB may electrically connect the display panel 200 to the printed circuit board PCB. A first end of the flexible printed circuit board FPCB may be connected to a surface of the substrate 210 exposed by the sealing layer 220. A second end of the flexible printed circuit board FPCB may be connected to the printed circuit board PCB. The flexible printed circuit board FPCB may be flexible. The flexible printed circuit board FPCB may be bent toward the lower surface of the substrate 210. As a result, the flexible printed circuit board FPCB may be connected or coupled to each of the display panel 200 and the printed circuit board PCB.

The printed circuit board PCB may transmit signals to the display panel 200 through the flexible printed circuit board FPCB and/or may receive signals from the display panel 200 through the flexible printed circuit board FPCB. Since the flexible printed circuit board FPCB may be bent, the printed circuit board PCB may adhere to the lower surface of the substrate 210. As a result, the printed circuit board PCB may be connected or coupled to the flexible printed circuit board FPCB. A connector CB may be connected to the printed circuit board PCB. The connector CB may be configured to receive signals from an external system.

The display apparatus DD may further include a touch panel. The touch panel may be disposed between the window 100 and the display panel 200. However, exemplary embodiments of the present inventive concept are not limited thereto. According to an exemplary embodiment of the present inventive concept, the touch panel may be disposed within the display panel 200. The touch panel may be a resistive-type touch panel, a capacitive-type touch panel, or an electromagnetic induction-type touch panel. The touch panel may obtain information of coordinates of a point at which a touch event occurs.

The window 100 may be disposed on the display panel 200. The window 100 may include a transmission area 100-AR and a non-transmission area 100-NAR. The transmission area 100-AR may transmit the image IM provided by the display panel 200. The non-transmission area 100-NAR may be adjacent to the transmission area 100-AR. The transmission area 100-AR may overlap and substantially correspond to the display area 200-AR of the display panel 200. The non-transmission area 100-NAR may overlap and substantially correspond to the non-display area 200-NAR of the display panel 200. The non-transmission area 100-NAR may at least partially surround the transmission area 100-AR when viewed from a plan view.

The window 100 may include a speaker part SP. The speaker part SP may be disposed at a portion of the non-transmission area 100-NAR. The speaker part SP may include at least one opening. A sound outputted from a speaker may be provided to a user through the speaker part SP.

The case member 300 may be disposed below the display panel 200. The case member 300 may be configured to receive the display panel 200. The case member 300 may be coupled to the window 100. The display panel 200 may be disposed between the case member 300 and the window 100. The case member 300 will be described in more detail below.

Figure 3:
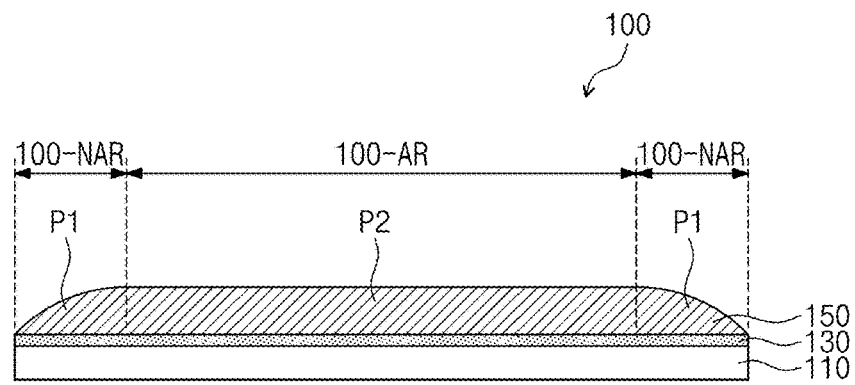
FIG. 3 is a cross-sectional view illustrating a window according to an exemplary embodiment of the present inventive concept.
Figure 3:
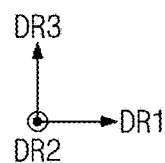
Figure 4:
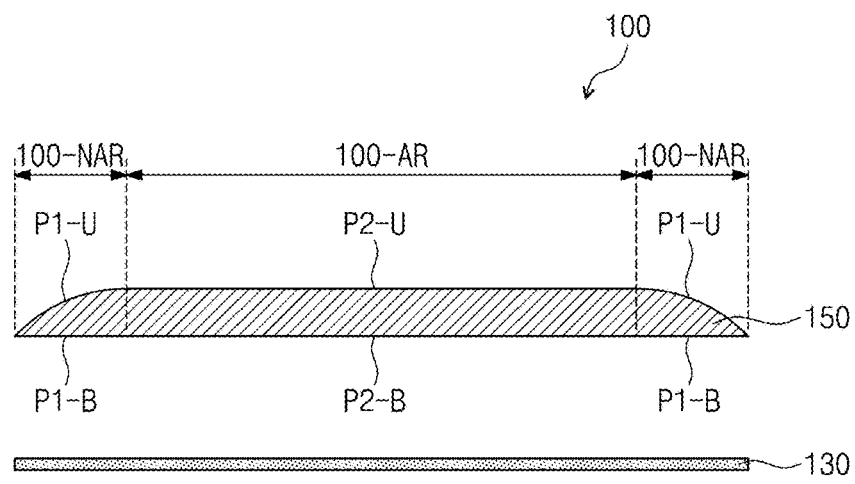
FIG. 4 is an exploded view illustrating a window according to an exemplary embodiment of the present inventive concept.
Figure 4:
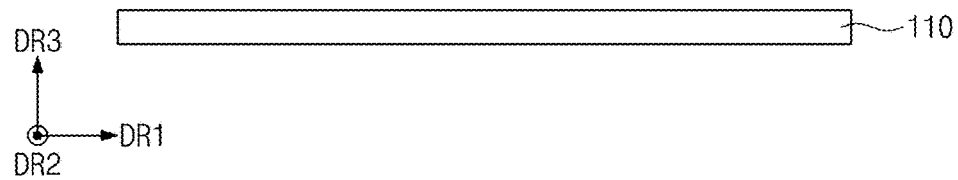

FIG. 3 is a cross-sectional view illustrating a window according to an exemplary embodiment of the present inventive concepts. FIG. 4 is an exploded view illustrating a window according to an exemplary embodiment of the present inventive concept. Hereinafter, the window 100 according to an exemplary embodiment of the present inventive concept will be described in more detail with reference to FIGS. 3 and 4.

Referring to FIGS. 3 and 4, the window 100 may include a base member 110, a protective member 150, and a coupling member 130.

The base member 110 may be relatively rigid. For example, the base member 110 may include glass, sapphire, or plastic. The base member 110 may have a substantially uniform thickness. The base member 110 may have a flat plate shape.

The protective member 150 may be disposed on the base member 110. The protective member 150 may be relatively flexible with respect to the base member 110. The protective member 150 may include a film. The film may include polymethylmethacrylate (PMMA) or polycarbonate (PC). Thus, a shape of the protective member 150 may be changed or processed with relative ease compared to a shape of the base member 110.

The protective member 150 may include a first portion P1 and a second portion P2. The first portion P1 may overlap the non-transmission area 100-NAR of the window 100. The second portion P2 may overlap the transmission area 100-AR of the window 100. The second portion P2 may be connected to the first portion P1. The second portion P2 may be surrounded by the first portion P1 when viewed from a plan view.

The first portion P1 may include a first upper surface P1-U and a first lower surface P1-B. The first lower surface P1-B may be opposite to the first upper surface P1-U. The first upper surface P1-U may be curved. The first lower surface P1-B may be relatively flat. The first lower surface P1-B may be substantially parallel to a plane defined by the first direction DR1 and the second direction DR2.

The first upper surface P1-U may have a curved surface. The first upper surface P1-U may be curved from a plane substantially parallel to the first lower surface P1-B.

A distance in the third direction DR3 between the first upper surface P1-U and the first lower surface P1-B (e.g., a thickness of the first portion P1) may gradually decrease as a distance from the second portion P2 increases. A rate of thinning of the first portion P1 may increase as a distance from the second portion P2 increases.

According to an exemplary embodiment of the present inventive concept, an entire portion of the first portion P1 corresponding to the non-display part NAR of the display apparatus DD may have the first upper surface P1-U which is curved as illustrated in FIGS. 3 and 4. However, exemplary embodiments of the present inventive concept are not limited thereto. For example, a portion of the first portion P1 may have the first upper surface P1-U which is curved.

The second portion P2 may include a second upper surface P2-U and a second lower surface P2-B. The second upper surface P2-U may be connected to the first upper surface P1-U. The second lower surface P2-B may be opposite to the second upper surface P2-U. The second lower surface P2-B may be connected to the first lower surface P1-B. The second upper surface P2-U and the second lower surface P2-B may be substantially parallel to a plane defined by the first direction DR1 and the second direction DR2. The second portion P2 may have a substantially uniform thickness. The second upper surface P2-U may be substantially flat. However, exemplary embodiments of the present inventive concept are not limited thereto. For example, at least a portion of the second upper surface P2-U may have a curved shape.

According to an exemplary embodiment of present the inventive concept, the protective member 150 having a thickness greater than a thickness of the base member 110 may be provided. However, exemplary embodiments of the present inventive concept are not limited thereto. For example, the thickness of the protective member 150 may be equal to or less than the thickness of the base member 110.

The coupling member 130 may be disposed between the base member 110 and the protective member 150. The coupling member 130 may couple the base member 110 to the protective member 150. The coupling member 130 may include an adhesive film or an adhesive tape. To absorb an external impact, the coupling member 130 may include a material having a relatively low modulus, e.g., polyurethane.

The window 100 may further include a coating layer. The coating layer may be disposed on the protective member 150. At least one coating layer may be provided. For example, the coating layers may include various functional layers. The functional layers may be a hard coating layer and an AF coating layer (e.g., an anti-fouling layer or an anti-fingerprint layer). The hard coating layer may prevent a scratching of the window 100. The AF layer may prevent contamination of the window 100.

According to an exemplary embodiment of the present inventive concept, since the protective member 150 may completely cover the upper surface of the base member 110, damage to the base member 110, for example, by an external impact, may be prevented. Furthermore, the shape of the protective member 150 may be changed with relative ease. As a result, the slim window 100 having one of various designs and the display apparatus DD including the same may be provided.

Figure 5:
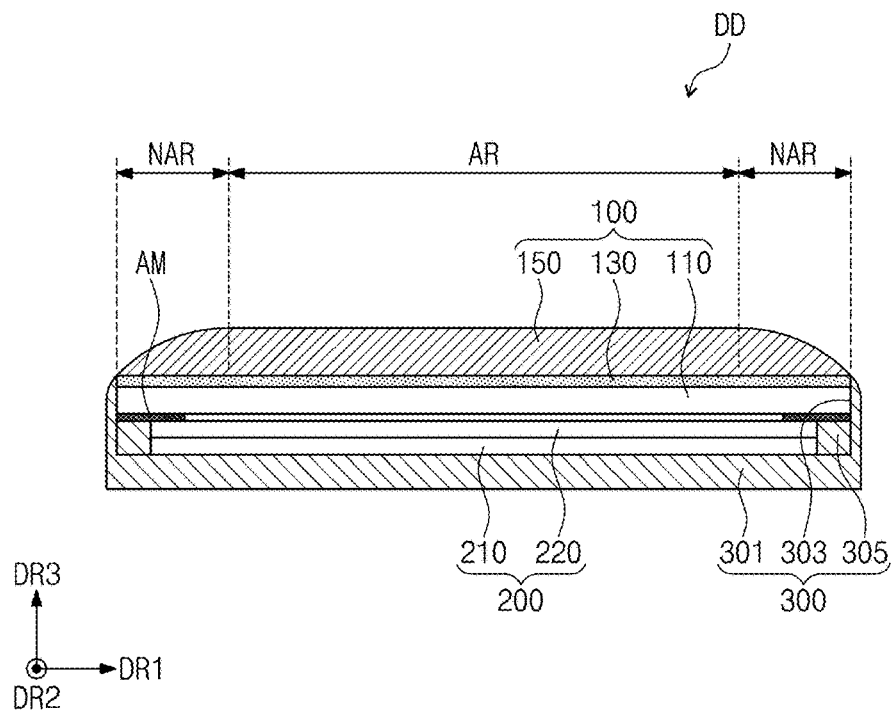
FIG. 5 is a cross-sectional view illustrating a display apparatus according to an exemplary embodiment of the present inventive concept.

FIG. 5 is a cross-sectional view illustrating a display apparatus according to an exemplary embodiment of the present inventive concept. Hereinafter, the display apparatus DD coupled with the window 100 and the case member 300 will be described in more detail with reference to FIG. 5.

Referring to FIGS. 2 and 5, the case member 300 may include a lower portion 301 and a sidewall portion 303. The lower portion 301 may face the back surface of the display panel 200. The sidewall portion 303 may be bent from the lower portion 301, for example, to extend in the third direction DR3. The lower portion 301 and the sidewall portion 303 may define an inner space, for example, in which the display panel 200 may be received. The lower portion 301 may be disposed to face the back surface of the base member 110. The sidewall portion 303 may be disposed to face a side surface of the base member 110.

According to an exemplary embodiment of the present inventive concept, a height of the sidewall portion 303 may be equal to a spaced distance from an upper surface of the lower portion 301 to an upper surface of the coupling member 130. Alternatively, the height of the sidewall portion 303 may be equal to a spaced distance from the upper surface of the lower portion 301 to the upper surface of the base member 110. Thus, even though an external impact may be applied to the display apparatus DD, the side surface of the base member 110 may be protected by the sidewall portion 303.

The case member 300 may further include a holding portion 305. The holding portion 305 may be adjacent to the sidewall portion 303. The holding portion 305 may be configured to support the window 100. The holding portion 305 may protrude from the sidewall portion 303 in the first direction DR1 and the second direction DR2. Since the case member 300 may further include the holding portion 305, a stepped shape may be formed along the sidewall portion 303 in the inner space. The stepped shape may be defined by the lower portion 301 and the sidewall portion 303.

According to an exemplary embodiment of the present inventive concept, the holding portion 305 may be connected to the sidewall portion 303 and the lower portion 301. However, exemplary embodiments of the present inventive concept are not limited thereto. For example, the holding portion 305 may be spaced apart from the lower portion 301 and may be connected to the sidewall portion 303. Alternatively, the holding portion 305 may be separated from the lower portion 301 and the sidewall portion 303. The shape of the holding portion 305 may be variously modified.

The holding portion 305 may correspond to an edge of the window 100. The holding portion 305 may support the window 100. An upper surface of the holding portion 305 may be disposed to face the back surface of the base member 110.

The display apparatus DD may further include an adhesive member AM. The adhesive member AM may overlap the non-display portion NAR of the display apparatus DD.

The adhesive member AM may be disposed on the back surface of the base member 110. The adhesive member AM may be disposed between the base member 110 and the sealing layer 220. The adhesive member AM may also be disposed between the base member 110 and the holding portion 305. Thus, the adhesive member AM may couple the window 100 to the display panel 200. In addition, the adhesive member AM may couple the window 100 to the case member 300.

Figure 6:
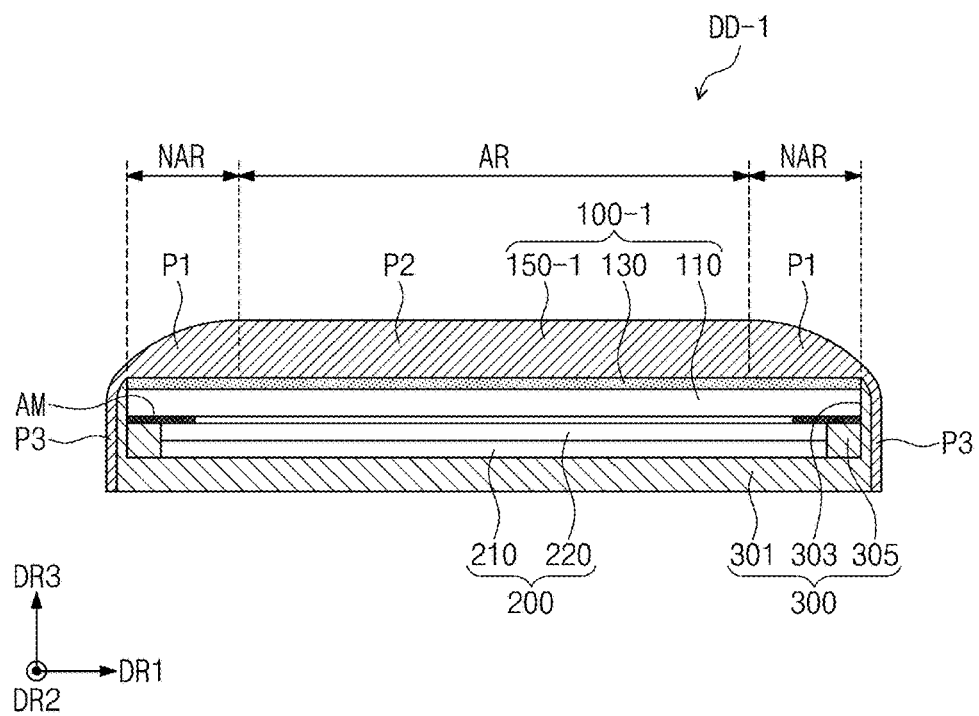
FIG. 6 is a cross-sectional view illustrating a display apparatus according to an exemplary embodiment of the present inventive concept.

FIG. 6 is a cross-sectional view illustrating a display apparatus according to an exemplary embodiment of the present inventive concept. Hereinafter, a window 100-1 and a display apparatus DD-1 including the same according to an exemplary embodiment of the present inventive concept will be described with reference to FIG. 6. Differences between the present exemplary embodiment and the above exemplary embodiments will be mainly described and the same or similar descriptions may be omitted.

Referring to FIG. 6, the window 100-1 according to an exemplary embodiment of the present inventive concept may include a protective member 150-1. The protective member 150-1 may have a first portion P1, a second portion P2, and a third portion P3.

The third portion P3 may extend from the first portion P1. The third portion P3 may be disposed on the sidewall portion 303 of the case member 300. The third portion P3 may cover an outer side surface of the sidewall portion 303. The third portion P3 may further extend to cover at least a portion of an outer surface of the lower portion 301 of the case member 300.

According to an exemplary embodiment of the present inventive concept, since the protective member 150-1 may further include the third portion P3, a foreign material may be prevented from being injected into the display apparatus DD-1. In addition, since the protective member 150-1 surrounds the window 100-1 and the case member 300, the display apparatus DD-1 may be protected from an external impact without an additional protective case.

Figure 7:
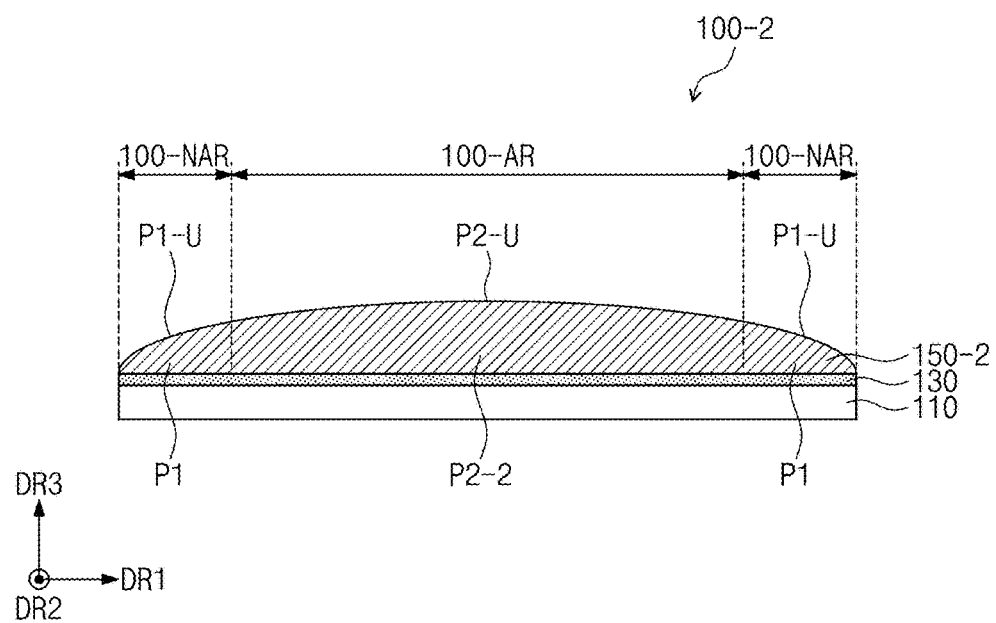
FIG. 7 is a cross-sectional view illustrating a window according to an exemplary embodiment of the present inventive concept.

FIG. 7 is a cross-sectional view illustrating a window according to an exemplary embodiment of the present inventive concept. Hereinafter, a window 100-2 according to an exemplary embodiment of the present inventive concepts will be described with reference to FIG. 7. Differences between the present exemplary embodiment and the above exemplary embodiments will be mainly described and the same or similar descriptions as in the above exemplary embodiments may be omitted. Referring to FIG. 7, the window 100-2 according to an exemplary embodiment of the present inventive concept may include a protective member 150-2. The protective member 150-2 may include a first portion P1 and a second portion P2-2.

The protective member 150-2 may include the first portion P1 overlapping a non-transmission area 100-NAR of the window 100-2. The protective member 150-2 may also include the second portion P2-2 overlapping with a transmission area 100-AR of the window 100-2. The second portion P2-2 may be connected to the first portion P1. The second portion P2-2 may be at least partially surrounded by the first portion P1 when viewed from a plan view.

The first portion P1 may include a first upper surface P1-U. The first upper surface P1-U may be curved. The second portion P2-2 may include a second upper surface P2-U. The second upper surface P2-U may be connected to the first upper surface P1-U.

The second upper surface P2-U of the second portion P2-2 may have a curved shape. A thickness of the second portion P2-2 may gradually increase toward a center of the second portion P2-2.

The second upper surface P2-U of the second portion P2-2, a curvature of which is less than a curvature of the first upper surface P1-U of the first portion P1, is illustrated in FIG. 7. However, exemplary embodiments of the present inventive concept are not limited thereto. For example, the second upper surface P2-U of the second portion P2-2 may have substantially the same curvature as the first upper surface P1-U.

As described above, the shape of the protective member 150 may be changed with relative ease by material characteristics of the protective member 150. Thus, the slim window 100 having one of various designs and the display apparatus DD including the same may be provided.

According to an exemplary embodiment of the present inventive concept, damage to the window and the display apparatus including the same, for example, by an external impact, may be prevented.

In addition, the window and the display apparatus including the same according to an exemplary embodiment of the present inventive concept may be relatively thin.

While exemplary embodiments of the present inventive concept have been described herein, it will be apparent to those skilled in the art that various changes and modifications may be made without departing from the spirit and scopes of the present inventive concept.

What is claimed is:

1. A display apparatus, comprising:
a display panel configured to display an image;
a window disposed on the display panel, the window including a transmission area configured to transmit the image and a non-transmission area adjacent to the transmission area; and
a case member configured to receive the display panel, the case member coupled to the window,
wherein the window comprises:
a base member overlapping the transmission area and the non-transmission area and having a substantially flat plate shape;
a protective member disposed on the base member, the protective member comprising:
a first portion overlapping the non-transmission area and having a first upper surface; and
a second portion overlapping the transmission area and connected to the first portion,
wherein the first upper surface is curved; and
a coupling member disposed between the protective member and the base member, wherein the protective member is spaced apart from the base member, wherein the base member includes material that is different from that of the protective member.

2. The display apparatus of claim 1, wherein the base member has a substantially uniform thickness.

3. The display apparatus of claim 2, wherein the base member comprises glass or plastic.

4. The display apparatus of claim 1, wherein the second portion has a second upper surface of which at least a portion is substantially flat.

5. The display apparatus of claim 1, wherein the second portion has a second upper surface connected to the first upper surface, and
wherein the second upper surface is curved.

6. The display apparatus of claim 1, wherein a thickness of the first portion gradually decreases as a distance from the second portion increases.

7. The display apparatus of claim 6, wherein the first portion surrounds the second portion.

8. The display apparatus of claim 1, wherein the protective member comprises polymethylmethacrylate (PMMA) or polycarbonate (PC).

9. The display apparatus of claim 1, wherein the coupling member is configured to couple the protective member to the base member.

10. The display apparatus of claim 9, wherein the coupling member comprises polyurethane.

11. The display apparatus of claim 1, wherein the case member comprises:
a lower portion facing the display panel; and
a sidewall portion bent and extending from the lower portion.

12. The display apparatus of claim 11, wherein the case member further comprises: a holding portion configured to support the window, and
wherein a portion of the base member is disposed on the holding portion.

13. The display apparatus of claim 11, wherein the protective member further comprises: a third portion extending from the first portion, and
wherein the third portion covers an outer side surface of the sidewall portion.

14. The display apparatus of claim 1, wherein an entire upper surface of the base member is spaced apart from the protective member.

15. A window, comprising:
a base member including a transmission area configured to transmit an image and having a substantially flat plate shape; and
a protective member disposed on the base member,
wherein the protective member comprises:
a first portion having a first upper surface and a first lower surface, the first upper surface having a curved shape and the first lower surface being substantially flat;
a second portion connected to the first portion, the second portion having a second upper surface connected to the first upper surface; and a second lower surface connected to the first lower surface; and
a third portion extending from the first portion and disposed on a side surface of the base member.

16. The window of claim 15, wherein the first lower surface and the second lower surface are substantially flat.

17. The window of claim 16, wherein the second portion has a substantially uniform thickness, and
wherein the second upper surface is substantially parallel to the second lower surface.

18. The window of claim 16, wherein the second upper surface comprises a curved surface, and
wherein a thickness of the second portion becomes progressively greater toward a center of the second portion.

19. The window of claim 15, further comprising:
a coupling member disposed between the base member and the protective member, and the coupling member configured to couple the base member to the protective member.

20. A window, comprising:
a base member having a substantially flat plate shape and including a transmission area configured to transmit an image;
a coupling member disposed on the base member; and
a protective member disposed on the coupling member, wherein the protective member comprises:
a first portion having a first upper surface and a first lower surface, the first upper surface having a curved shape and the first lower surface having a substantially flat shape; and
a second portion connected to the first portion,
wherein the protective member is spaced apart from the base member, wherein the base member includes material that is different from that of the protective member.

21. The window of claim 20, wherein the coupling member is configured to couple the base member to the protective member.

22. The window of claim 20, wherein the second portion includes a second upper surface connected to the first upper surface; and a second lower surface connected to the first lower surface.

23. A display apparatus, comprising:
a display panel configured to display an image;
a window disposed on the display panel, the window including a transmission area configured to transmit the image and a non-transmission area adjacent to the transmission area; and
a case member configured to receive the display panel, the case member coupled to the window,
wherein the window comprises:
a base member having a substantially flat surface; and
a protective member disposed on the base member, the protective member comprising:
a first portion overlapping the non-transmission area and having a first upper surface;
a second portion overlapping the transmission area and connected to the first portion,
wherein the first upper surface is curved; and
a third portion extending from the first portion, wherein the third portion covers an outer portion of the case member.

* * * * *